(12) United States Patent
Worlitz

(10) Patent No.: US 10,266,083 B2
(45) Date of Patent: Apr. 23, 2019

(54) COVER MATERIAL, IN PARTICULAR SEAT COVER MATERIAL, AND VEHICLE INTERIOR ARRANGEMENT, IN PARTICULAR A SEAT ASSEMBLY

(71) Applicant: Faurecia Autositze GmbH, Stadthagen (DE)

(72) Inventor: Claudia Worlitz, Hannover (DE)

(73) Assignee: Faurecia Autositze GmbH, Stadhagen (DE)

( * ) Notice: Subject to any disclaimer, the term of this patent is extended or adjusted under 35 U.S.C. 154(b) by 82 days.

(21) Appl. No.: 15/436,959

(22) Filed: Feb. 20, 2017

(65) Prior Publication Data

US 2017/0327016 A1 Nov. 16, 2017

(30) Foreign Application Priority Data

May 10, 2016 (DE) .......................... 10 2016 108 632

(51) Int. Cl.
| | |
|---|---|
| *A47C 7/02* | (2006.01) |
| *B60N 2/58* | (2006.01) |
| *H03K 17/96* | (2006.01) |
| *B60N 2/02* | (2006.01) |
| *B60N 2/90* | (2018.01) |
| *B60N 2/806* | (2018.01) |
| *B60N 2/16* | (2006.01) |
| *B60N 2/20* | (2006.01) |

(Continued)

(52) U.S. Cl.
CPC ............. *B60N 2/58* (2013.01); *B60N 2/0228* (2013.01); *H03K 17/962* (2013.01); *B60N 2/16* (2013.01); *B60N 2/20* (2013.01); *B60N 2/56* (2013.01); *B60N 2/62* (2013.01); *B60N 2/66* (2013.01); *B60N 2/806* (2018.02); *B60N 2/976* (2018.02); *B60N 2/99* (2018.02); *B60R 16/0207* (2013.01); *H03K 2017/9602* (2013.01)

(58) Field of Classification Search
CPC .......... B60N 2/5678; B60N 2/58; B60N 2/66; B60N 2/62; B60N 2/56; B60N 2/20; B60N 2/976; B60N 2/99; H05B 1/0238; H05B 3/34; H05B 3/10; H05B 2203/003; H05B 2203/005; H05B 2203/014; H05B 2203/013; H05B 2203/029; H03K 17/962; H03K 2017/9602; B60R 16/0207
USPC ........ 297/180.12, 217.1, 213.3, 217.6, 452.1
See application file for complete search history.

(56) References Cited

U.S. PATENT DOCUMENTS

| | | | | |
|---|---|---|---|---|
| 5,928,548 | A * | 7/1999 | Johansson | A47C 7/748 219/217 |
| 6,663,175 | B2 * | 12/2003 | Mosquera | B60N 2/5883 219/217 |

(Continued)

FOREIGN PATENT DOCUMENTS

| | | |
|---|---|---|
| DE | 102013001772 A1 | 7/2014 |
| DE | 102014012754 A1 | 3/2016 |

(Continued)

*Primary Examiner* — Chi Q Nguyen
(74) *Attorney, Agent, or Firm* — Laurence P. Colton; Smith Tempel Blaha LLC

(57) ABSTRACT

A cover material, in particular a seat cover material, having an upper side and a lower side and at least one seam that runs over at least a part of the cover material and that is visible on the upper side. An electrically conductive element that generates an electric field is arranged on the lower side in the region where the seam runs.

11 Claims, 8 Drawing Sheets

(51) Int. Cl.
    *B60N 2/56*     (2006.01)
    *B60N 2/62*     (2006.01)
    *B60N 2/66*     (2006.01)
    *B60R 16/02*    (2006.01)

(56) References Cited

U.S. PATENT DOCUMENTS

| | | | | |
|---|---|---|---|---|
| 6,710,303 | B1* | 3/2004 | Lorenzen | H05B 3/34 |
| | | | | 174/84 R |
| 7,859,423 | B2* | 12/2010 | Yamanaka | B60N 2/5685 |
| | | | | 180/273 |
| 8,991,917 | B2* | 3/2015 | Kato | B60N 2/002 |
| | | | | 297/217.2 |
| 2002/0101110 | A1* | 8/2002 | Mosquera | B60N 2/5883 |
| | | | | 297/452.58 |
| 2005/0184565 | A1* | 8/2005 | Weiss | B60N 2/5635 |
| | | | | 297/180.15 |
| 2006/0027552 | A1* | 2/2006 | Krobok | H05B 3/34 |
| | | | | 219/217 |
| 2009/0001778 | A1* | 1/2009 | Nathan | B60N 2/5685 |
| | | | | 297/180.12 |
| 2013/0134745 | A1* | 5/2013 | Aoki | B60N 2/002 |
| | | | | 297/180.12 |
| 2015/0061345 | A1* | 3/2015 | Van Der Linden | H05K 1/028 |
| | | | | 297/452.1 |
| 2015/0266405 | A1* | 9/2015 | Fitzpatrick | B60N 2/5685 |
| | | | | 297/180.12 |
| 2016/0052432 | A1* | 2/2016 | Lafferty | B60N 2/5685 |
| | | | | 297/180.12 |

FOREIGN PATENT DOCUMENTS

| | | |
|---|---|---|
| EP | 1839941 B1 | 1/2007 |
| JP | 2011233441 A | 11/2011 |

\* cited by examiner

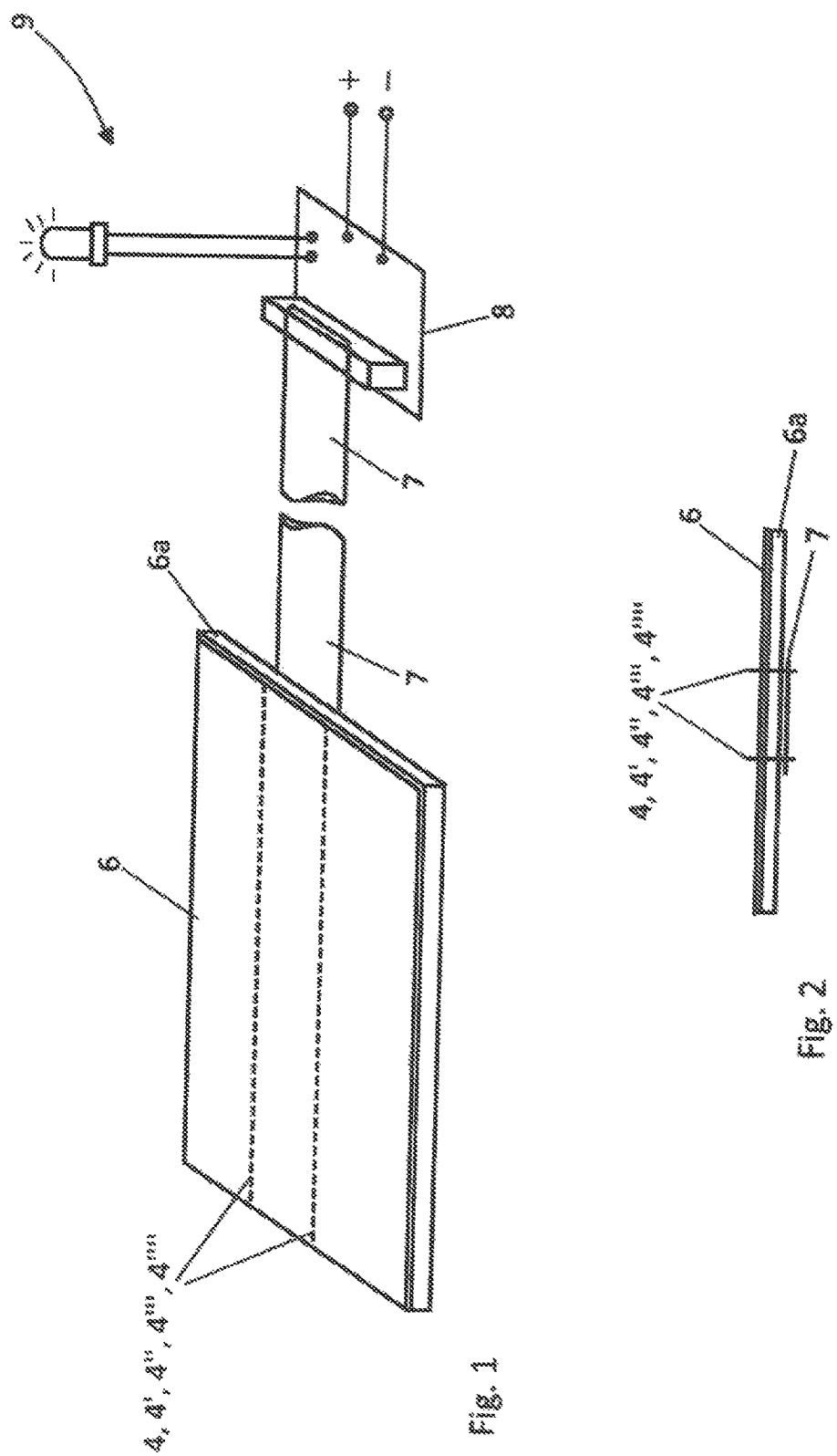

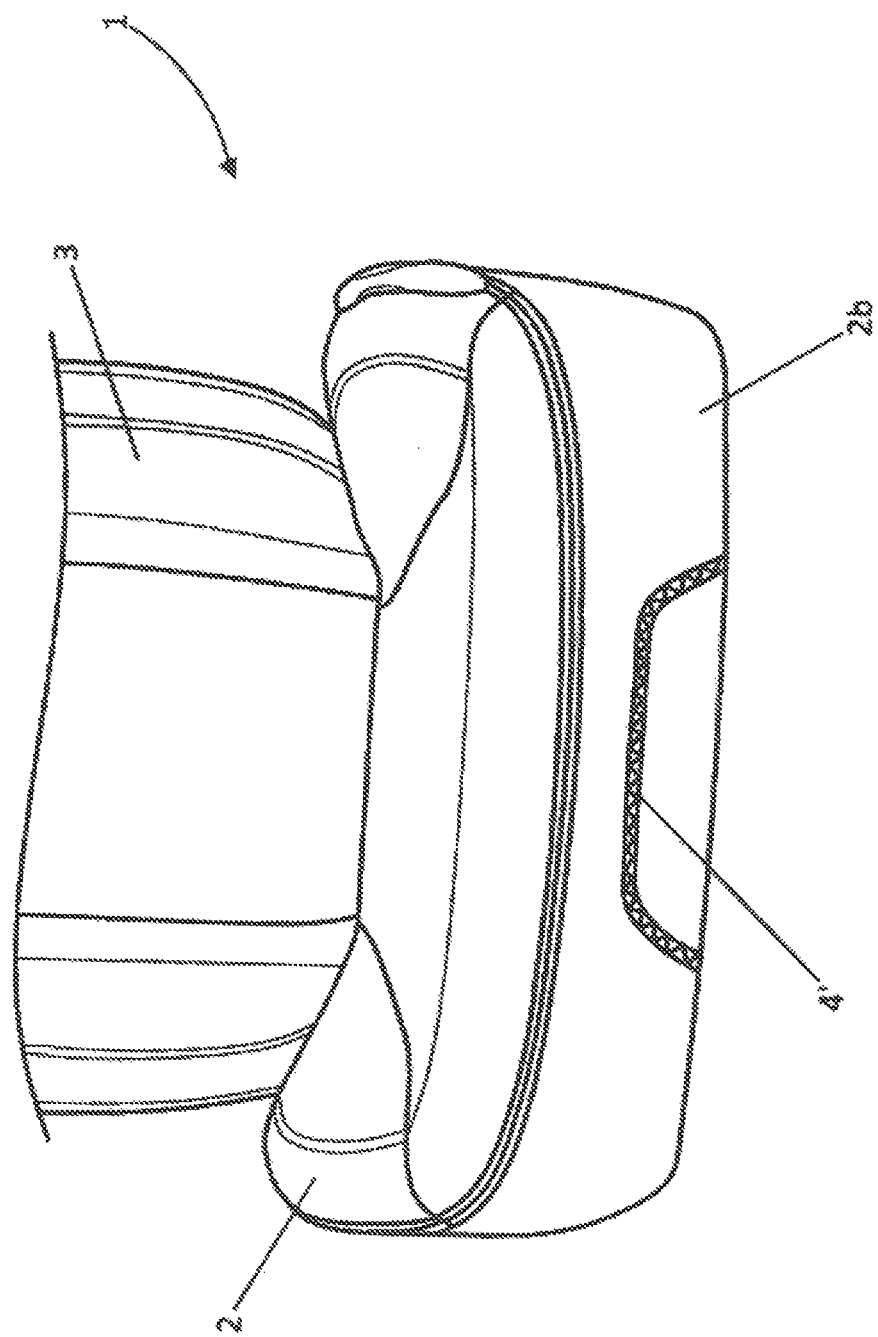

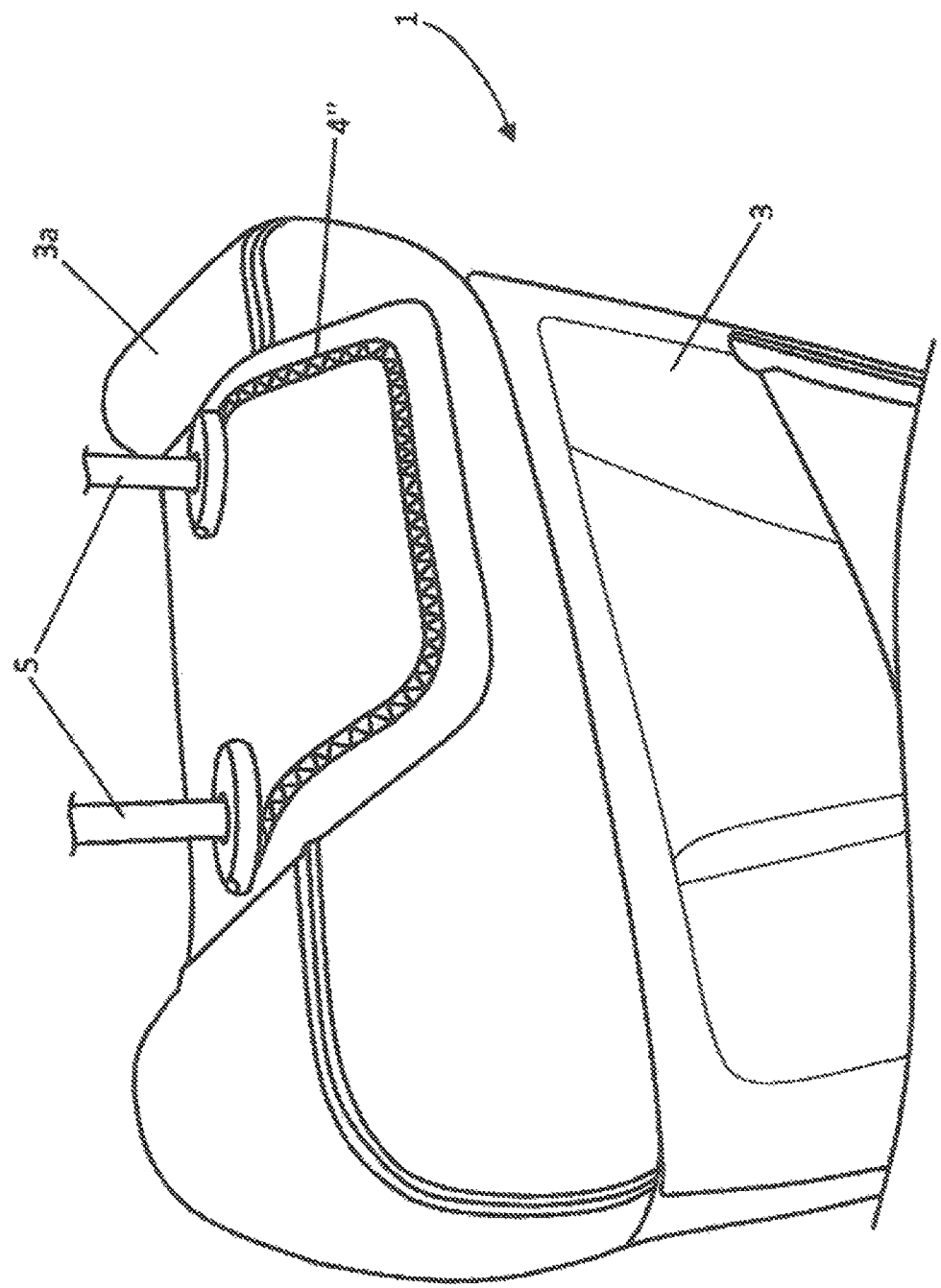

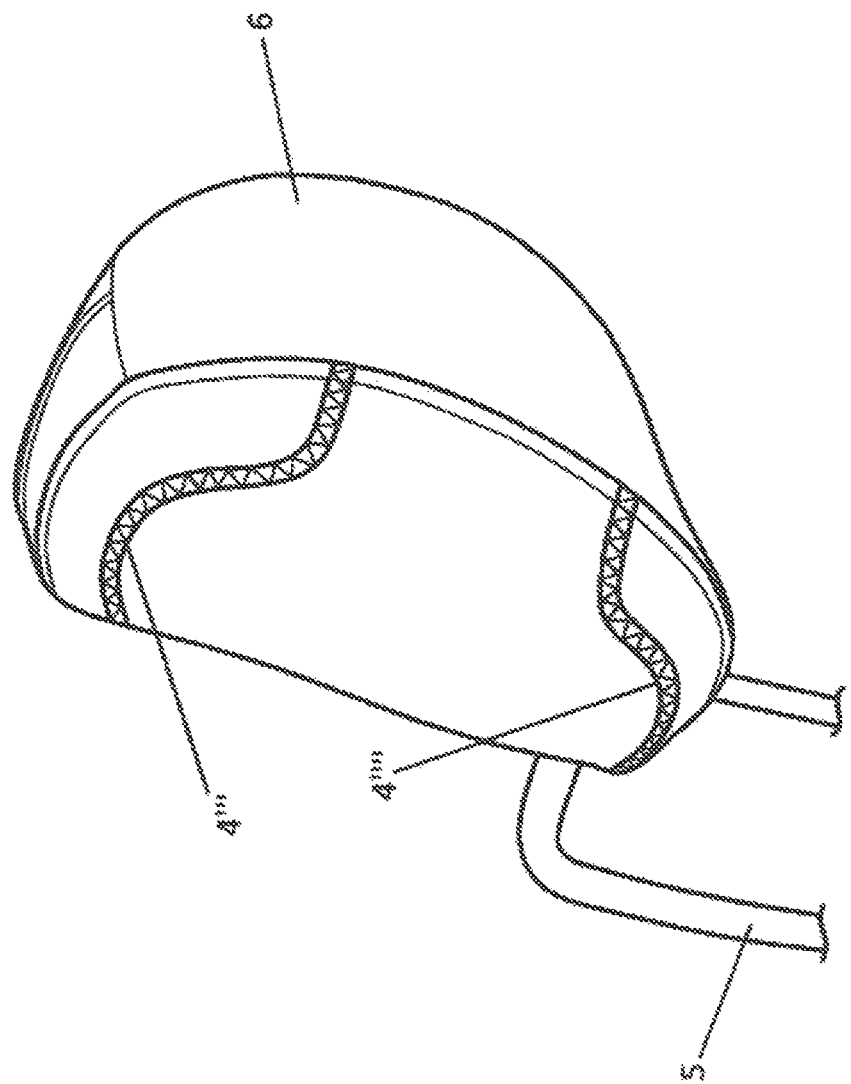

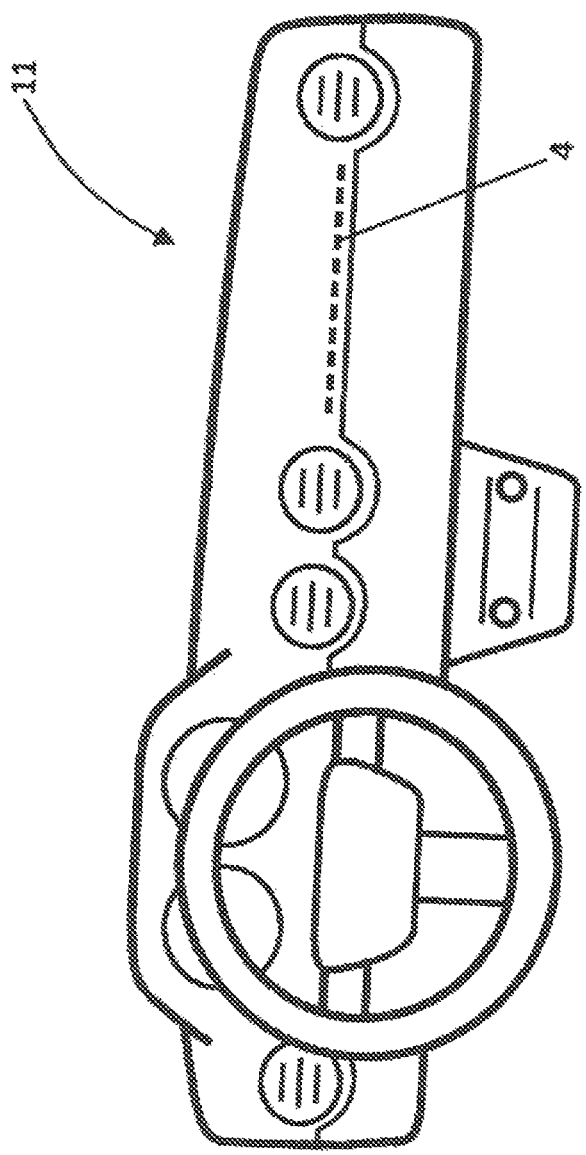

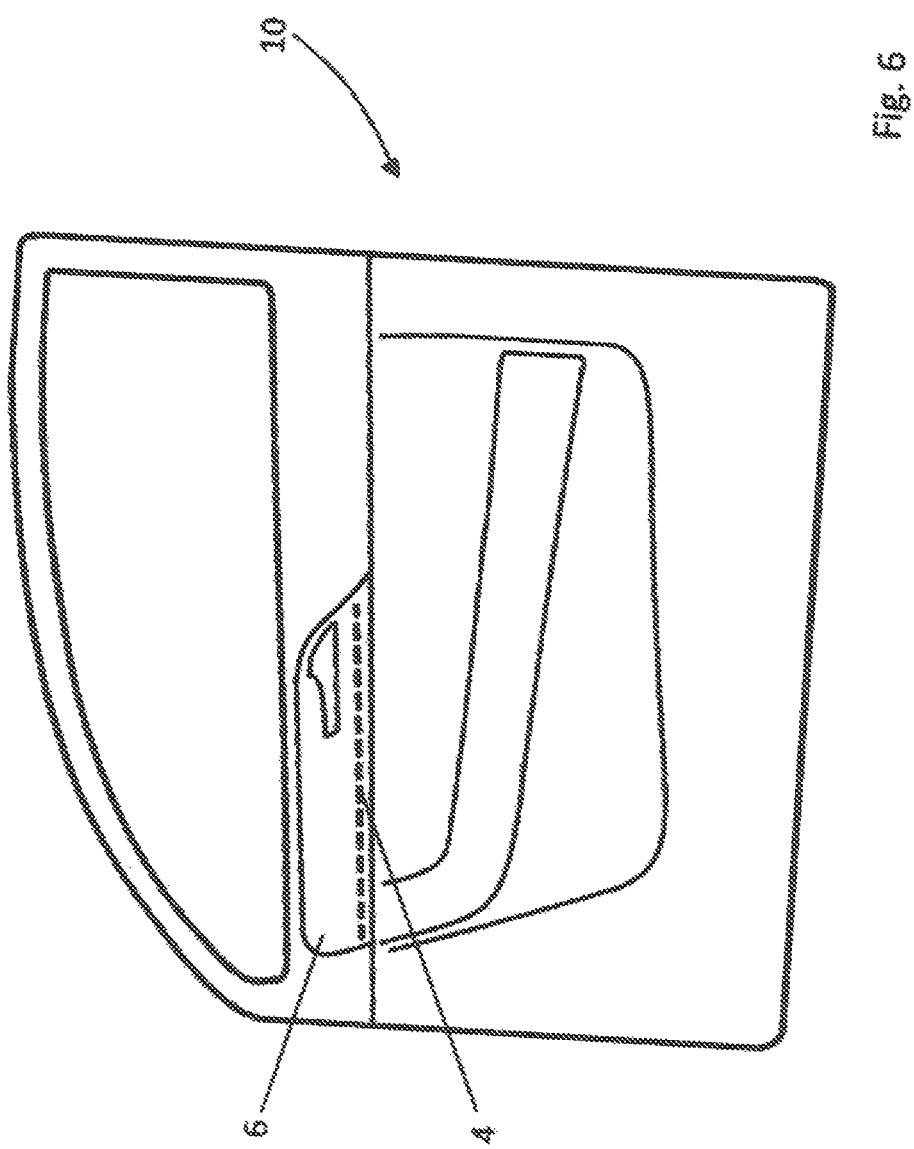

COVER MATERIAL, IN PARTICULAR SEAT COVER MATERIAL, AND VEHICLE INTERIOR ARRANGEMENT, IN PARTICULAR A SEAT ASSEMBLY

STATEMENT OF RELATED APPLICATIONS

This patent application claims priority on and the benefit of German Patent Application No. 10 2016 108 632.0 having a filing date of 10 May 2016.

BACKGROUND OF THE INVENTION

Technical Field

The invention relates to a cover material, in particular seat cover material, with an upper side and a lower side and with at least one seam that runs over at least a part of the cover material and that is visible on the upper side, and a vehicle interior arrangement, in particular a seat assembly, especially a vehicle seat assembly, having a seat, in particular a vehicle seat, with a backrest and a seat part as well a seat cover.

Prior Art

Adjustments in vehicle interiors, especially seat adjustments of electrically adjustable seats, are carried out, inter alia, by means of switches that are installed to the side of the seat, in the center console, dashboard, in the interior panel of the door or on armrests. Because of their installation depth, these switches take up space and require integration into the design of the components. For this reason, they are often installed in places where they will not disrupt the overall visual appearance.

JP 2011 233 441 A discloses a fabric switch that is structured such that two fabrics with electric conductors passing through them are bound into a sandwich with an interposed insulation fabric. The insulation fabric is penetrated at those points where the push-buttons are supposed to be placed, and an elastic ring is incorporated between the conductive foils.

In this way, the two conductive fabrics can be connected through the opening in the ring and thereby complete a circuit. These fabrics can be applied to the lateral surfaces of backrests or armrests as components of the upholstery. They can likewise be components of the door panel. As a result of their fabric structure, these push-buttons can be adapted to every surface contour and thus allow more room for the interior design. Existing switches are replaced by a more elastic embodiment in this technology.

A similar solution is disclosed by EP 1 839 941 B1. The active switching element in a seat control is a touch-sensitive fabric, a sandwich consisting of two planes of conductive fabric, between which an insulation fabric is placed. This fabric is applied to a substrate and covered with a cover layer that can transmit information about the switching functions. Corresponding buttons, including those constructed with conventional switches, are equipped with these switching elements. Not only can the touch sensor constructed in this way simply perform the switching but it can also evaluate the force with which the button is being pushed. Thus it is possible, for example, to control the adjustment speed of the selected function depending upon the pressure.

DE 10 2014 012 754 A1 discloses a control panel that consists of proximity sensors and that can be installed directly on the substrate or under the upholstery. This proximity switch can function capacitively, thermally, optically or with radar. To prevent an unintended triggering of the controller, the system is switched to stand-by and is activated by piezo-controlled knock sensors, for instance. This technology replaces a visible conventional control panel with one that is flexible and concealed under fabric.

DE 10 2013 001 772 A1 takes a different approach; a fabric permeated with light guides is used for the cladding of doors, armrests, seats and/or center consoles. Corresponding light sources are provided at one end of the light guides and sensors at the other end. Owing to the total reflection on the walls of the light guides, very little light emerges from the light guides when in the quiescent state; the sensor receives a quiescent current. When a user presses on the fabric and thus on the light guide, the total reflection is suspended at the bending points so that the sensor receives less light or no light. This fall-off in light is used for switching purposes.

A disadvantage of the described solutions, particularly in the field of vehicle seats, is that moisture penetrating into the seat can cause switching errors. This can result in leakage currents or, in optical switches, to a decline in total reflection.

BRIEF SUMMARY OF THE INVENTION

The problem addressed by the invention consists in developing a secure, moisture-resistant switching system for the interior of a vehicle, in particular a cover material therefor, which can be unobtrusively integrated into the vehicle interior, e.g. in a seat cover.

The problem is solved by a cover material, in particular seat cover material, with an upper side and a lower side and with at least one seam that runs over at least a part of the cover material and that is visible on the upper side, characterized in that an electrically conductive element that generates an electric field is arranged on the lower side in the region where the seam runs, and a vehicle interior, in particular a seat assembly, especially a vehicle seat assembly, having a seat, in particular a vehicle seat, with a backrest and a seat part as well a seat cover according to one of the preceding claims, wherein the electrically conductive element is set at an electric potential that differs from the ground potential and thereby generates an electric field.

Further preferred embodiments represent the subject matter of the dependent claims.

According to the invention, a cover material is provided which has an upper side and a lower side and with at least one seam, which is visible on the upper side, running over at least a part of the cover material, wherein an electrically conductive element that generates an electric field is arranged on the lower side in the region where the seam runs. If the electrically conductive element is set to a potential different from the ground potential, then an electric field is generated which is modified by the presence of the user's finger in the region or on the seam. According to the invention, a control unit can detect this modification and further process it as a switching pulse in order to control or actuate particular functions, such as adjustments or illuminations.

Within the meaning of the invention, the cover material is understood to be a single- or multi-layer material, especially a flexible material, which serves to line a part of the vehicle interior and also functions as upholstery material.

The visible seam can usually also be configured in the form of buttons. In this way, the user can feel the switch locations with his or her hand without making eye contact. The desired function can be triggered without the user needing to look closely at the switch area.

In a preferred embodiment of the seat cover, the electrically conductive element is a conductive surface, e.g. in the form of a strip, with at least one electrically conductive section. The switch area can have different lengths, depending upon the desired switching function.

An on/off function requires only a single touch. If the forward and backward movement of the seat is supposed to be adjusted, for example, then the switch can take the form of a position bar and be elongate in configuration; alternatively, depending on the point of contact of an elongate switching element, the duration or frequency of the movement can also be controlled by a control unit in the electronics.

In an especially preferred embodiment, the electrically conductive element is attached to the lower side of the cover material by the seam. When sewing the seam, it is also possible to fix the electrically conductive element to a part of the seat cover while sewing the cover material together. However, it is also possible that the seam is decorative stitching that serves simply to provide orientation for the hand or finger. The creation of the decorative stitching can also be combined with attaching the electrically conductive element in this instance.

In a further preferred embodiment, the seam or the cover material is not electrically conductive. The fewer elements with which the user comes into contact, the safer the system, even if the field of automotive engineering works in the low-voltage range.

In a very much preferred embodiment, the cover material is configured in multiple layers. Multi-layer cover material can provide a barrier to moisture or liquids so that the system is as resistant as possible to the ingress of moisture. In a further preferred embodiment, the electrically conductive element is permeable to liquid and is encapsulated in a non-conductive encapsulation so that contact with ambient humidity is prevented.

The claimed vehicle interior arrangement, which in particular is a seat assembly, especially a vehicle seat assembly, has a seat, in particular a vehicle seat, with a backrest and a seat part as well as cover material, as has been described above, wherein the electrically conductive element is set at an electric potential that differs from the ground potential and thereby generates an electric field.

The seat assembly can further have a control unit which is coupled with the electrically conductive element such that the electric field is modified when the user's finger approaches, especially touches, the upper side of the seat cover in the vicinity of the seam. In this regard, the control unit is designed such that it receives an electrical signal generated by the modification of the electric field. The control unit can process the signals and emit control pulses, with which a seat function can then be controlled.

Thus the seat assembly preferably has at least one seat function that can be accessed by the control unit as a result of the generated signal. Seat functions can include at least one of the following functions: Backrest angle adjustment, seat length adjustment, seat height adjustment, illumination, seat ventilation, seat heating, seat depth adjustment, lumbar support adjustment, headrest adjustment, side bolster adjustment, seat massage function.

BRIEF DESCRIPTION OF THE DRAWINGS

The invention is explained in greater detail below on the basis of embodiments in FIGS. 1 through 3D. Although the examples primarily show the configuration of the cover material as a seat cover or seat cover material, the invention is not restricted to this, and so all parts of the vehicle interior with seams, in particular the cover materials, can be configured according to the present invention.

FIG. 1 shows, in a principle sketch, a section of a claimed cover material.

FIG. 2 shows a cross-section through this type of cover material.

FIGS. 3A through 3D show various embodiments of a claimed vehicle interior using the example of a seat assembly.

FIG. 5 shows a further application example for a claimed cover material in the area of the dashboard.

FIG. 6 shows yet another application example for a claimed cover material in the area of a vehicle door.

DETAILED DESCRIPTION OF PREFERRED EMBODIMENTS

Figure 3A:
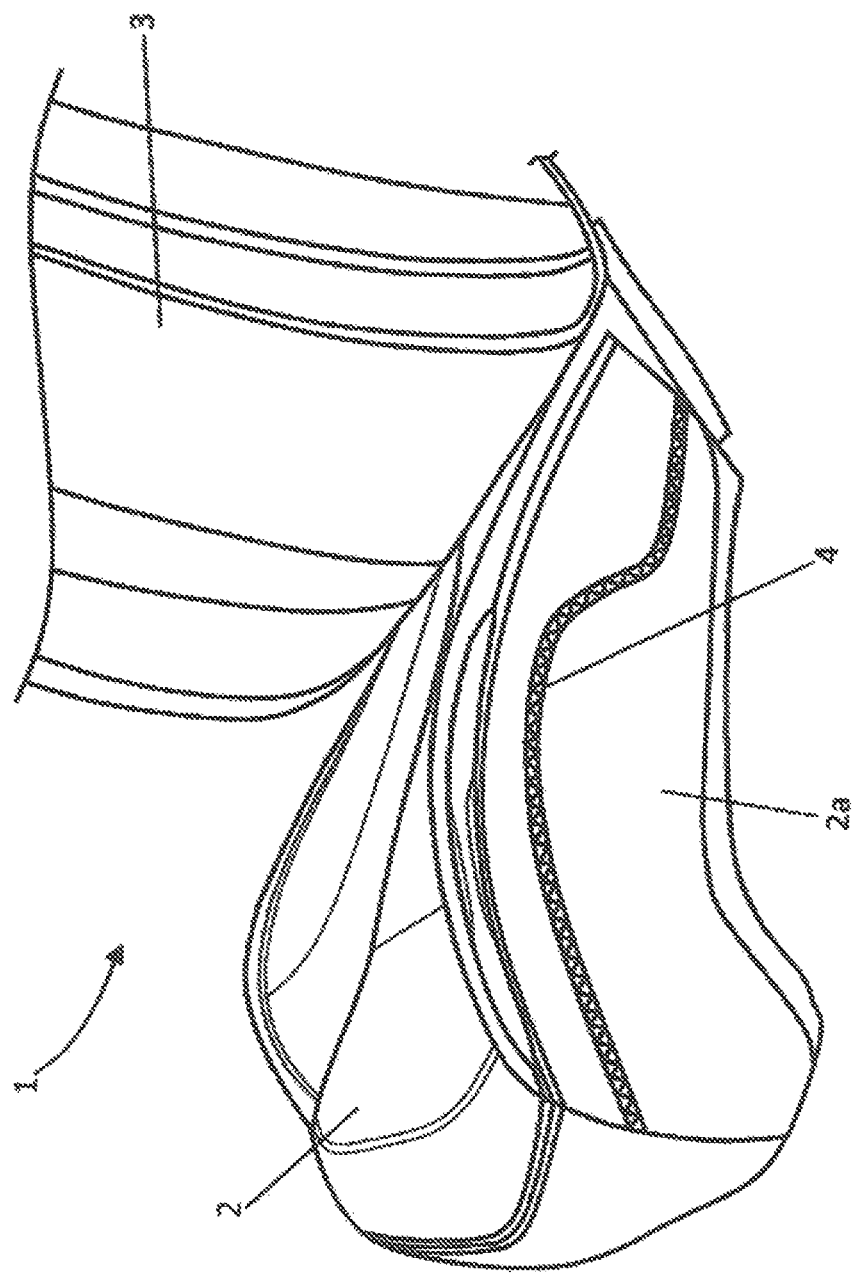

FIG. 1 shows a section of the cover material 6 and the functional principle of the technology accommodated in the cover material 6. In the embodiment shown, the cover 6 consists of the cover surface, which is applied to a substrate material 6a. It is preferred that the cover surface, which is not conductive, is applied to the substrate material 6a.

However, it is also conceivable that the cover surface is laminated, adhered or otherwise attached to the substrate material 6a. An electrically conductive element 7 is arranged on the lower side of the seat cover 6. This electrically conductive element is preferably a fabric or fabric strip that is interwoven with electrically conductive threads or has an electrically conductive coating. It is also possible that the electrically conductive element 7 consists of a conductive foil, a fabric of conductive carbon fibers, a metallically coated fabric or a combination thereof.

Said electrically conductive element 7 is attached to the seat cover 6 preferably by being sewn on. The double seam 4, 4', 4'', 4''', 4'''' shown here has the advantage over other attachment techniques that it can be seen and felt on the surface of the seat cover 6. A user can use it to orient the hand on the surface of the seat cover 6 and perform the desired accessible electric function 9, especially seat functions. It is entirely possible to configure the seam 4, 4', 4'', 4''', 4'''' as a simple seam, and a zig-zag seam can likewise be introduced between the double seams, as well as any other known form of seam that provides haptic support for locating the switch area.

According to the invention, the arrangement functions as a capacitive sensor. The electrically conductive element 7 is thus set at an electric potential different from the ground potential. If the user's finger presses on the seat cover 6 or if the finger comes close to the conductive element 7, the electric field between the electrically conductive element 7 and the finger is modified.

This is expressed in a measurable change in the capacitance of the capacitive sensor, which can be evaluated by the downstream control electronics 8 so that an electric control function 9 can be triggered by the signal; simple illumination, for example. In this case, the shield electrode is advantageous, since other instances in which the hand approaches the seam 4, 4', 4'', 4''', 4'''' are not supposed to be detected.

It is also conceivable to configure the element 7 as part of the capacitor and, accordingly, to provide capacitor plates below the element 7 that are charged for this purpose. In this way, various switch locations can be produced over the longitudinal extent of the element 7, if it is configured e.g. as a strip, thereby permitting position detection along the seam.

FIG. 2 shows a cross-section of the arrangement according to FIG. 1, in which the electrically conductive element 7 is disposed below the seat cover 6.

FIG. 3A shows the embodiment of a vehicle interior using the example of a seat assembly, wherein the seat 1 is only partially shown. The drawing shows the seat part 2 and the lower part of the backrest 3. A seam 4 is shown on the side element 2a of the seat part 2, behind which an electrically conductive element 7 (concealed) is sewn on or is otherwise applied below the seam 4. Sensors (concealed) or control units 8 (concealed), with which the seat functions can be adjusted electrically, can be applied at various locations on the seam 4. In a different embodiment, which is shown in FIG. 3B, the control function 8 is applied to the front element 2b of the seat part 2.

This is visible externally as a result of seam 4', since the technology is installed below the seat cover 6, i.e. it is not externally visible.

A further embodiment of the invention is shown in FIG. 3C. This figure shows the rear side of the backrest 3. A seam 4" is shown in the upper region 3a of the backrest 3, i.e. in the area where the headrest 5 is attached. In this embodiment, a reading lamp for rear passengers could be controlled. For example, LED lights could be installed within the cloth of the seat cover 6 and the backrest 3 provided with the seam 4", and a rear passenger could turn them on and off or regulate brightness by means of the switch and control unit 8 installed below the seam 4".

FIG. 3D shows a further variation of the invention. In this embodiment, the seams 4''', 4'''' are applied to the seat cover 6 of the headrest 5. It is possible to adjust the height and inclination of the headrest 5, for example, by touching the lateral surfaces of the headrest 5.

Figure 4:
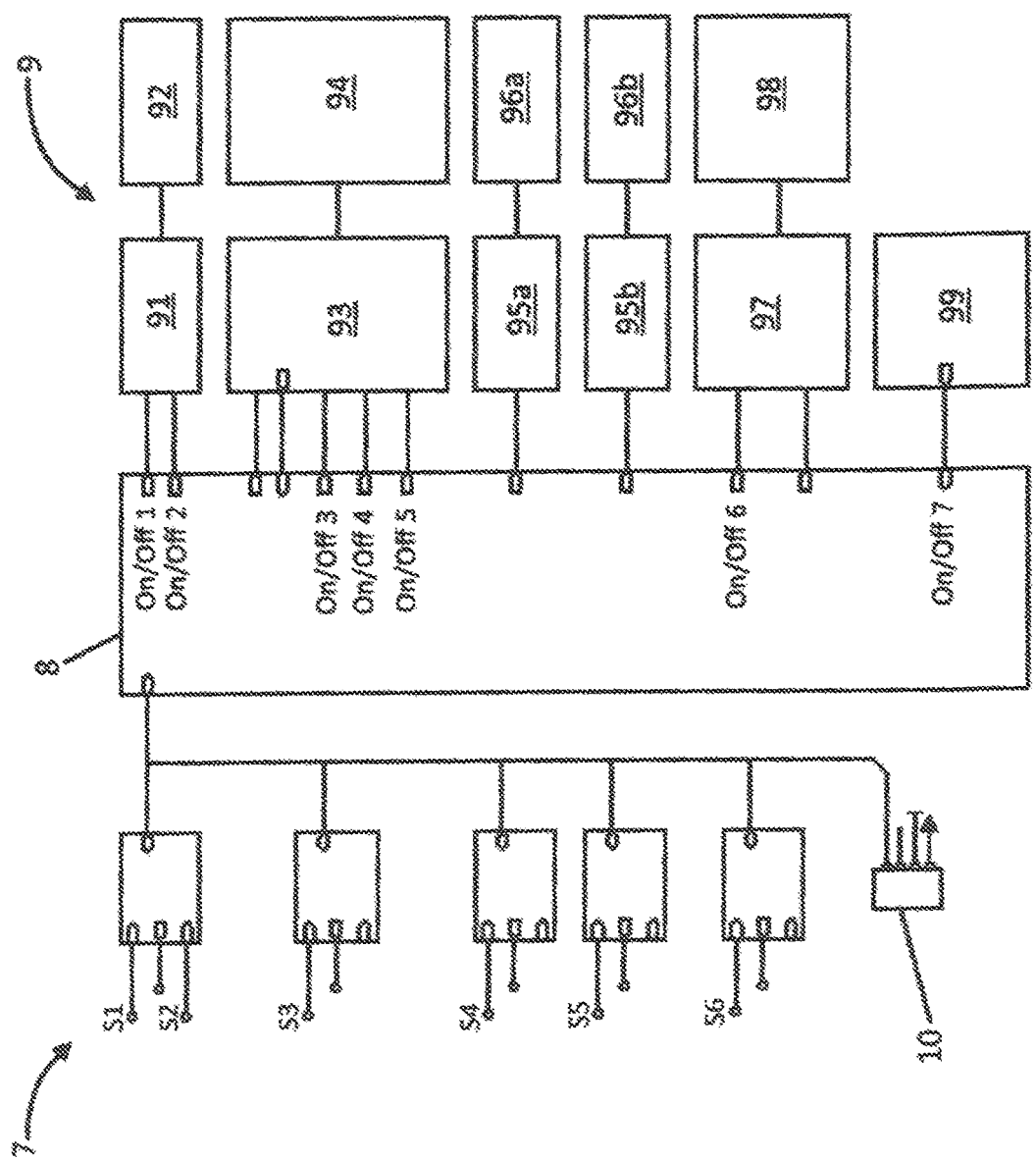
FIG. 4 shows an exemplary switch arrangement for the claimed vehicle interior.

FIG. 4 shows a switch arrangement of a claimed seat assembly. Electrically conductive elements 7 configured as a row of sensors S1 through S6 are arranged below a seam 4, 4', 4'', 4''', 4'''' (not shown here). In this example, the individual sensors S1 through S6 are arranged in a row. In a preferred embodiment, seams are applied to various seat elements 2, 3, 5, and the sensors S1 through S6 corresponding to the electrically accessible seat functions 9 that are associated with the respective seat elements 2, 3, 5 are arranged below said seams.

Nevertheless, it is also possible to provide multiple seams 4 in one place, such as on the side element 2a of the seat part 2, with the sensors S1 through S6 for various functional groups disposed below the seams. Component 10 provides a reference potential, and changes relative thereto caused by manual actuation of the switches can be detected by one of the sensors S1 through S6.

Each of S1 through S6 is linked to the control unit 8 via a bus. This control unit 8 evaluates the sensor signals and activates the appropriate electric seat function 9. Examples of this are: adjusting the length of the seat 1, adjusting the height and inclination of the seat part 2, the inclination of the backrest 3, adjusting the headrest 5, inflating and deflating supporting cushions, backseat lighting, heating the seats. This list of examples does not rule out other electrically accessible seat functions 9. The functions that are not seat functions, such as adjusting the vehicle heating, the internal lighting and the instrument illumination, can also conceivably be controlled with the switches.

In the example shown, for example, 91 identifies a switch for turning the motor 92 in a headrest on and off. The motor 92 can also move or displace other parts of the seat. 93 identifies a circuit for adjusting the heat in the seat or vehicle. LEDs or heating elements 94, for example, can be triggered by means of this circuit. Circuits 95a, 95b for the seating light 96a and the ambient lighting 96b can likewise be provided by the control unit 8.

Pneumatic circuits 97, for instance, can also be activated via the control unit 8 in order to open or close valves 98 so as to adjust cushion elements by inflating or deflating pneumatic elements (bubbles). Finally, the control unit 8 can also adjust the sensors S1 through S6 in terms of their responsiveness; an appropriate circuit 99 can be provided for this purpose, too.

FIGS. 5 and 6 show examples of locations in the vehicle interior at which the invention can also be employed. As is shown in FIG. 5, for example, the cover 6 of dashboard 11 can have a seam 4 configured in the manner according to the invention. The inner sides of vehicle doors 10 (FIG. 6) can likewise include the claimed cover materials 6.

Apart from the examples shown, other solutions are also possible. It makes sense to place the switch locations anywhere that can be easily reached by the hand or a finger.

LIST OF REFERENCE SIGNS

1 Seat
2 Seat part
2a Side element of 2
2b Front element of 2
3 Backrest
3a Upper side of 3
4, 4', 4", 4''', 4'''' Seam
5 Headrest
6 Cover material seat cover
6a Substrate material
7 Electrically conductive elements
8 Control unit
9 Accessible electric seat functions
10 Vehicle door
11 Dashboard

What is claimed is:

1. A vehicle seat assembly, comprising:
   a vehicle seat, with a backrest (3), a seat part (2), and a seat cover (6);
   an electrically conductive element (7) set at an electric potential that differs from the ground potential and thereby generates an electric field; and
   a control unit (8), which is coupled with the electrically conductive element (7) such that the electric field is modified when a user's finger approaches or touches an upper side of the seat cover (6) in the vicinity of a seam (4, 4', 4", 4''', 4''''), and wherein the control unit (8) receives an electric signal generated by a modification of the electric field.

2. The vehicle interior according to claim 1, wherein the vehicle seat assembly has an electric seat function (9), that is accessible by the control unit (8) as a result of the generated signal.

3. The vehicle interior according to claim 2, wherein the electric seat function includes at least one function selected from the group consisting of: backrest angle adjustment, seat length adjustment, seat height adjustment, illumination, seat ventilation, seat heating, seat depth adjustment, lumbar support adjustment, headrest adjustment, side bolster adjustment, and seat massage function.

4. The vehicle interior according to claim 1, wherein the seam (4, 4', 4", 4''', 4'''') runs over at least a part of the seat cover (6) and is visible on the upper side of the seat cover (6), and the electrically conductive element (7) that generates the electric field is arranged on a lower side (6a) of the seat cover (6) in a region where the seam (4, 4', 4", 4''', 4'''') runs.

5. The vehicle interior according to claim 4, wherein the electrically conductive element (7) is a strip with at least one electrically conductive section.

6. The vehicle interior according to claim 4, wherein the electrically conductive element (7) is attached to the seat cover by the seam (4, 4', 4", 4''', 4'''') on the lower side.

7. The vehicle interior according to claim 4, wherein the seam (4, 4', 4", 4''', 4'''') and the cover material (6) are not electrically conductive.

8. The vehicle interior according to claim 4, wherein the cover material (6) is configured in multiple layers.

9. The vehicle interior according to claim 4, wherein the electrically conductive element (7) is encapsulated so that the electrically conductive element (7) is impermeable to moisture.

10. The vehicle interior according to claim 4, wherein the seam (4, 4', 4", 4''', 4'''') is not electrically conductive.

11. The vehicle interior according to claim 4, wherein the cover material (6) is not electrically conductive.

* * * * *